(12) United States Patent
Mori (10) Patent No.: US 10,361,193 B2
(45) Date of Patent: Jul. 23, 2019

(54) INTEGRATED CIRCUIT COMPOSED OF TUNNEL FIELD-EFFECT TRANSISTORS AND METHOD FOR MANUFACTURING SAME

(71) Applicant: NATIONAL INSTITUTE OF ADVANCED INDUSTRIAL SCIENCE AND TECHNOLOGY, Tokyo (JP)

(72) Inventor: Takahiro Mori, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 327 days.

(21) Appl. No.: 15/125,263

(22) PCT Filed: Feb. 20, 2015

(86) PCT No.: PCT/JP2015/054710
§ 371 (c)(1),
(2) Date: Sep. 12, 2016

(87) PCT Pub. No.: WO2015/137081
PCT Pub. Date: Sep. 17, 2015

(65) Prior Publication Data
US 2017/0077092 A1    Mar. 16, 2017

(30) Foreign Application Priority Data

Mar. 11, 2014 (JP) ................................ 2014-047609

(51) Int. Cl.
H01L 27/088  (2006.01)
H01L 21/265  (2006.01)
(Continued)

(52) U.S. Cl.
CPC ...... H01L 27/088 (2013.01); H01L 21/26513 (2013.01); H01L 21/823418 (2013.01);
(Continued)

(58) Field of Classification Search
CPC ............ H01L 21/6836; H01L 21/6838; H01L 21/761; H01L 21/76251; H01L 21/76254;
(Continued)

(56) References Cited

U.S. PATENT DOCUMENTS

2002/0177260 A1  11/2002  Matsumoto
2006/0091490 A1   5/2006  Chen et al.
2007/0267700 A1  11/2007  Russ et al.

FOREIGN PATENT DOCUMENTS

EP    0469611 A1    2/1992
JP    2009-164453 A  7/2009
JP    2013-074288 A  4/2013

OTHER PUBLICATIONS

Extended European Search Report (EESR), dated Aug. 29, 2017, for corresponding European Patent Application No. EP 15761826.
(Continued)

*Primary Examiner* — Sonya D. McCall-Shepard
(74) *Attorney, Agent, or Firm* — Pergament & Cepeda LLP; Milagros A. Cepeda; Edward D. Pergament (57) ABSTRACT

The present invention provides an integrated circuit formed of tunneling field-effect transistors that includes a first tunneling field-effect transistor in which one of a first P-type region and a first N-type region operates as a source region and the other one operates as a drain region; and a second tunneling field-effect transistor in which one of a second P-type region and a second N-type region operates as a source region and the other one operates as a drain region, the first and second tunneling field-effect transistors being formed in one active region to have the same polarity, the first P-type region and the second N-type region being
(Continued)

formed adjacently, the adjacent first P-type region and second N-type region being electrically connected through metal semiconductor alloy film.

4 Claims, 10 Drawing Sheets

(51) Int. Cl.
    *H01L 29/417*     (2006.01)
    *H01L 27/12*     (2006.01)
    *H01L 21/8234*     (2006.01)
    *H01L 21/84*     (2006.01)

(52) U.S. Cl.
    CPC .......... *H01L 21/84* (2013.01); *H01L 27/1203* (2013.01); *H01L 29/41725* (2013.01)

(58) Field of Classification Search
    CPC ......... H01L 21/76852; H01L 21/76895; H01L 21/76897; H01L 21/8221; H01L 21/823418; H01L 21/823475; H01L 21/823828; H01L 21/823
    USPC .............................. 257/392, 32, 27, 39, 401
See application file for complete search history.

(56) References Cited

OTHER PUBLICATIONS

Mantl et al., "Si based tunnel field effect transistors: Recent achievements," Ultimate Integration on Silicon (ULIS), 2013 14th International Conference on, IEEE, Mar. 19, 2013, pp. 15-20.
International Search Report dated Apr. 21, 2015, for corresponding International Patent Application No. PCT/JP2015/054710. (With English Translation).
Written Opinion dated Apr. 21, 2015, for corresponding International Patent Application No. PCT/JP2015/054710. (With English Translation).
International Preliminary Report on Patentability dated Sep. 13, 2016, for corresponding International Patent Application No. PCT/JP2015/054710.
Choi et al., "Tunneling Field-Effect Transistors (TFETs) With Subthreshold Swing (SS) Less Than 60 mV/dec", IEEE Electron Device Letters, Aug. 2007, pp. 743 to 745, vol. 28—issue No. 8.
Weste and Eshraghian, Principles of CMOS VLSI Design, A Systems Perspective, 2nd Edition, Addison-Wesley Publishing company, 1983, pp. 148 to 153. (With English Translation).

INTEGRATED CIRCUIT COMPOSED OF TUNNEL FIELD-EFFECT TRANSISTORS AND METHOD FOR MANUFACTURING SAME

This application is a National Phase application under 35 U.S.C. 371 of International Application No. PCT/JP2015/054710, filed on Feb. 20, 2015, which claims priority to Japanese provisional application No. 2014-047609, filed on Mar. 11, 2014, all of which are hereby incorporated by references in their entireties.

TECHNICAL FIELD

The present invention relates to an integrated circuit formed of tunneling field-effect transistors and a method for producing the same, and particularly relates to an integrated circuit formed of tunneling field-effect transistors which utilize electron tunneling and operate by controlling a tunneling current based on a gate voltage and a method for producing the same.

BACKGROUND ART

Tunneling field-effect transistors have a characteristic of being able to operate at a low voltage compared with field-effect transistors currently used as basic elements of semiconductor integrated circuits. Use of tunneling field-effect transistors as basic elements of semiconductor integrated circuits enables reduction of power consumption of the semiconductor integrated circuits. Such a tunneling field-effect transistor is disclosed in, e.g., W. Y. Choi et al., "Tunneling Field-Effect Transistors (TFETs) with Sub-threshold Swing (SS) Less Than 60 mV/dec", IEEE Electron Device Letters Vol. 28, p. 743 (2007).

In existing integrated circuits using field-effect transistors, it is possible to connect a plurality of field-effect transistors in a manner to share the same channel, by disposing gates of the plurality of field-effect transistors in one active region (see, e.g., "Principle of CMOC VLSI design-from systems perspective", translation supervised by Takashi Tomizawa and Yasuo Matsuyama, Maruzen Co., Ltd.). That is, for connecting, for example, two MOS-type field-effect transistors in a manner to share the same channel, an active region for a source region of one of the field-effect transistors and an active region for a drain region of the other one of the field-effect transistors are provided in common because these active regions are to be adjacent to each other and formed of diffusion layers of the same conductivity type (P type or N type), whereas gates of the respective field-effect transistors are disposed separately from each other. This reduces an area needed and cost, and also suppresses parasitic capacitance and parasitic resistance due to interconnection, leading to boosting of performance.

In the present specification, "active region" refers to a region at which semiconductor is exposed, when a top surface of a wafer is seen in a state that there is nothing formed on the wafer. A device is formed in an active region. There are cases where a plurality of devices are formed in a linked state in an active region.

SUMMARY OF INVENTION

Technical Problem

However, in integrated circuits using tunneling field-effect transistors, source regions and drain regions of the tunneling field-effect transistors have different conductivity types. Therefore, the same method as the method for connecting a plurality of existing field-effect transistors results in formation of a PN junction (i.e., an insulating region formed of a depletion layer) between a source region and a drain region adjacent to each other, to make it impossible for the source region and the drain region to be electrically connected with each other. Simply, it is possible to realize the electrical connection by disposing the adjacent two tunneling field-effect transistors in active regions one by one and connecting the drain region of one of the tunneling field-effect transistors with the source region of the other tunneling field-effect transistor through a metal interconnect disposed in a manner to bridge these active regions. However, this increases an area needed for formation of the circuit and consequently increases cost, and also brings about increase in an interconnection length accompanied by increase in parasitic capacitance, leading to a problem that an operation speed of the integrated circuit is slow.

The present invention has been made in view of the respects described above, and has an object to provide an integrated circuit formed of tunneling field-effect transistors that require a smaller area and a lower cost for formation of their electrically connected circuit and suppress parasitic capacitance and parasitic resistance, and a method for producing the same.

Solution to Problem

Means for solving the above problems are as follows.

In one aspect, the present invention provides an integrated circuit formed of tunneling field-effect transistors, the integrated circuit including:

a first tunneling field-effect transistor in which one of a first P-type region and a first N-type region operates as a source region and the other one operates as a drain region; and a second tunneling field-effect transistor in which one of a second P-type region and a second N-type region operates as a source region and the other one operates as a drain region, the first tunneling field-effect transistor and the second tunneling field-effect transistor being formed in one active region to have the same polarity, the first P-type region and the second N-type region being formed adjacently, the first P-type region and the second N-type region that are adjacent being electrically connected with each other through a metal semiconductor alloy film.

In one variant, the present invention provides the integrated circuit formed of tunneling field-effect transistors according to the present invention, wherein the metal semiconductor alloy film is formed in a manner to bridge the first P-type region and the second N-type region that are formed down to predetermined formation depths from a surface of a semiconductor layer and are disposed in a manner to face each other, and the metal semiconductor alloy film is formed down to a depth equal to or deeper than the formation depths of the first P-type region and the second N-type region from a position of the surface of the semiconductor layer.

In one variant, the present invention provides the integrated circuit formed of tunneling field-effect transistors according to the present invention, wherein the metal semiconductor alloy film is formed in a manner to bridge the first P-type region and the second N-type region that are formed down to predetermined formation depths from a surface of a semiconductor layer and are disposed in a manner to face each other, and the metal semiconductor alloy film is formed down to a depth shallower than the formation depths of the first P-type region and the second N-type region from a position of the surface of the semiconductor layer.

In one aspect, the present invention provides a method for producing an integrated circuit formed of tunneling field-effect transistors, the method including:
a gate electrode forming step of forming a first layer stacked structure and a second layer stacked structure on a common semiconductor layer at positions spaced from each other, the first layer stacked structure including a first insulating film and a first gate electrode stacked on the first insulating film, the second layer stacked structure including a second insulating film and a second gate electrode stacked on the second insulating film;
an ion implanting step of forming a first P-type region adjacently to the first layer stacked structure by implantation of P-type impurity ions and a second N-type region adjacently to the second layer stacked structure by implantation of N-type impurity ions in a surface of the semiconductor layer between the first layer stacked structure and the second layer stacked structure, and forming a first N-type region adjacently to the first layer stacked structure and in the surface of the semiconductor layer at a position opposite to the first P-type region by implantation of the N-type impurity ions and a second P-type region adjacently to the second layer stacked structure and in the surface of the semiconductor layer at a position opposite to the second N-type region by implantation of the P-type impurity ions, the first P-type region, the second P-type region, the first N-type region, and the second N-type region being formed in a manner that the first P-type region and the second N-type region are adjacent to each other;
a sidewall forming step of forming a first sidewall on both of side surfaces of the first layer stacked structure on the semiconductor layer and a second sidewall on both of side surfaces of the second layer stacked structure on the semiconductor layer; and
a metal semiconductor alloy film forming step of forming a metal film on the semiconductor layer between the first sidewall and the second sidewall and heating the metal film to allow the metal film to react with the semiconductor layer to form a metal semiconductor alloy film.

In one variant, the present invention provides the method for producing an integrated circuit formed of tunneling field-effect transistors according to the present invention,
wherein the metal semiconductor alloy film forming step is a step of forming the metal semiconductor alloy film in a manner to bridge the first P-type region and the second N-type region that are formed down to predetermined formation depths from the surface of the semiconductor layer and are disposed in a manner to face each other, and forming the metal semiconductor alloy film down to a depth equal to or deeper than the formation depths of the first P-type region and the second N-type region from a position of the surface of the semiconductor layer.

In one variant, the present invention provides the method for producing an integrated circuit formed of tunneling field-effect transistors according to the present invention, wherein the metal semiconductor alloy film forming step is a step of forming the metal semiconductor alloy film in a manner to bridge the first P-type region and the second N-type region that are formed down to predetermined formation depths from the surface of the semiconductor layer and are disposed in a manner to face each other, and forming the metal semiconductor alloy film down to a depth shallower than the formation depths of the first P-type region and the second N-type region from a position of the surface of the semiconductor layer.

Advantageous Effects of Invention

According to the present invention, an area needed can be smaller than in a configuration in which a drain region of one tunneling field-effect transistor and a source region of another tunneling field-effect transistor are connected with each other through a metal interconnect disposed in a manner to bridge two active regions. Therefore, cost can be reduced, and parasitic capacitance and parasitic resistance due to interconnection can be suppressed.

DESCRIPTION OF EMBODIMENTS

Next, an embodiment of the present invention will be described with reference to the drawings.

Figure 1:
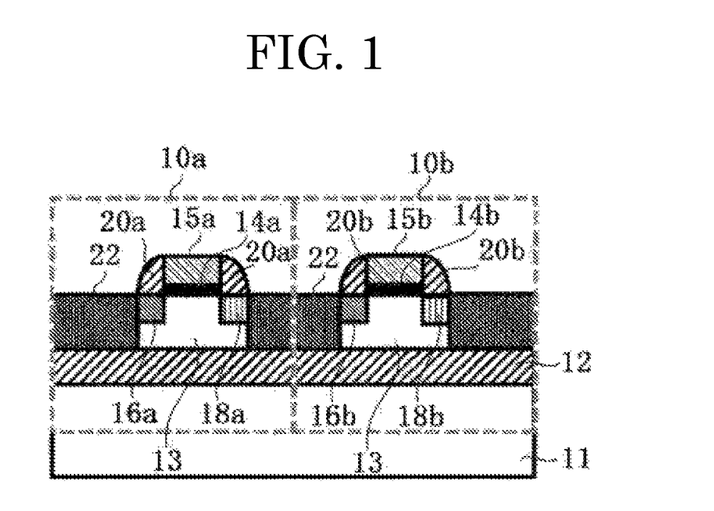
FIG. 1 is a cross-sectional view of a structure of an integrated circuit formed of tunneling field-effect transistors of the present invention according to an embodiment.

FIG. 1 illustrates a cross-sectional view of a structure of an integrated circuit formed of tunneling field-effect transistor of the present invention according to an embodiment. An integrated circuit formed of tunneling field-effect transistors according to the present embodiment illustrated in the view includes: a first tunneling field-effect transistor 10a and a second tunneling field-effect transistor 10b that are formed in one active region to have the same polarity; and a titanium silicide (TiSi) film 22 that is an example of a metal semiconductor alloy film and configured to electrically connect the first tunneling field-effect transistor 10a and the second tunneling field-effect transistor 10b.

In the present specification, "the same polarity" means that two tunneling field-effect transistors have the same transistor operation characteristic, which is either a P-type transistor or an N-type transistor.

The tunneling field-effect transistors (hereinafter may also be referred to as TFET) 10a and 10b are formed of a wafer having a structure in which a BOX (Buried Oxide) layer 12, which is an insulating film and a silicon monocrystal (SOI: Silicon-On-Insulator) layer 13 forming a semiconductor layer are stacked on a surface of a Si support substrate 11, which is a silicon monocrystal layer. The first TFET 10a has a structure in which an N$^+$ region 16a and a P$^+$ region 18a are formed in the wafer in a manner to be spaced apart from and face each other and a gate electrode 15a is formed on a surface of the wafer between the N$^+$ region 16a and the P$^+$ region 18a via a gate insulating film 14a. Meanwhile, the second TFET 10b has a structure in which an N$^+$ region 16b and a P$^+$ region 18b are formed in the wafer in a manner to be spaced apart from and face each other and a gate electrode 15b is formed on the surface of the wafer between the N$^+$ region 16b and the P$^+$ region 18b via a gate insulating film 14b.

The first TFET 10a and the second TFET 10b have the same polarity. The P$^+$ region 18a of the first TFET 10a and the N$^+$ region 16b of the second TFET 10b adjacent to each other each operate as a source region when the other functions as a drain region, and are electrically connected with each other through the TiSi film 22.

Figure 2:
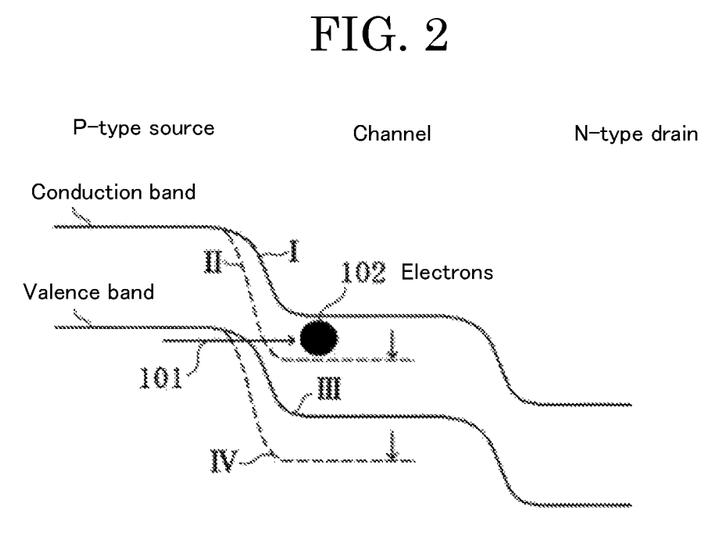
FIG. 2 is a diagram illustrating an example of a band structure for description of an operation of a tunneling field-effect transistor.

The TFETs 10a and 10b have the same polarity. For example, a case where the TFETs 10a and 10b both operate as N-type transistors will be described with reference to the band structure diagram of FIG. 2. During operation as N-type transistors, the P$^+$ regions 18a and 18b operate as source regions, and the N$^+$ regions 16a and 16b operate as drain regions. That is, when a positive gate voltage is applied to the gate electrodes 15a and 15b, a conduction band changes from I to II and a valence band changes from III to IV as illustrated in FIG. 2. This lowers a height of a barrier and causes electrons 102 to be transported from the P-type source regions to the channel region by quantum tunneling as illustrated by an arrow 101 to become a drain current.

When operating the TFETs 10a and 10b as P-type transistors, conversely to the above, the P$^+$ regions 18a and 18b are operated as drain regions and the N$^+$ regions 16a and 16b are operated as source regions, and a negative gate voltage is applied to the gate electrodes 15a and 15b. This causes holes to be transported in a direction from the N-type source regions to the P-type drain regions by quantum tunneling to become a drain current. For descriptive convenience, it has been described that a positive gate voltage is applied when the TFETs are operated as N-type transistors and that a negative gate voltage is applied when the TFETs are operated as P-type transistors. However, in an actual circuit, it is possible to operate the TFETs as N-type transistors when a source voltage is lower (i.e., when a drain voltage is higher) and operate the TFETs as P-type transistors when the source voltage is higher (i.e., when a drain voltage is lower). Therefore, it is possible to select a P-type or N-type transistor operation irrespective of whether the gate voltage is positive or negative.

The description returns to FIG. 1. In the integrated circuit formed of tunneling field-effect transistors according to the present embodiment, the P$^+$ region 18a of the first TFET 10a and the N$^+$ region 16b of the second TFET 10b formed in one active region of the SOI substrate are connected with each other through the TiSi film 22 that is formed in a partial regional range of the P$^+$ region 18a and the N$^+$ region 16b including a boundary portion at which the P$^+$ region 18a and the N$^+$ region 16b adjoin each other (specifically, the partial regional range being a substrate surface region at a position between sidewalls 20a and 20b within a region in which the P$^+$ region 18a and the N$^+$ region 16b are formed) and is formed down to a depth deeper than the depths of the P$^{3+}$ region 18a and the N$^+$ region 16b. This realizes electrical connection between the TFETs 10a and 10b.

According to the present embodiment, the two TFETs 10a and 10b are formed in one active region to have the same polarity, the P$^{3+}$ region 18a and the N$^+$ region 16b are formed adjacently, and the P$^+$ region 18a and the N$^+$ region 16b that are adjacent to each other are electrically connected with each other through the TiSi film 22. Therefore, as compared with a configuration in which two TFETs are electrically connected with each other through a metal interconnect disposed in a manner to bridge the two active regions, reduction can be obtained in an area needed and cost, and parasitic capacitance and parasitic resistance due to interconnection can be suppressed, leading to boosting of performance. In the example illustrated in FIG. 1, the TiSi film 22 is formed down to a depth that is deeper than the depths of the P$^+$ region 18a and the N$^+$ region 16b that are adjacent to each other. This is for interposing the TiSi film 22 between the P$^+$ region 18a and the N$^+$ region 16b to effectively prevent occurrence of an unintended leakage current that may flow across the PN junction.

Next, an embodiment of a method for producing an integrated circuit formed of tunneling field-effect transistors of the present invention will be described.

Figure 3A:
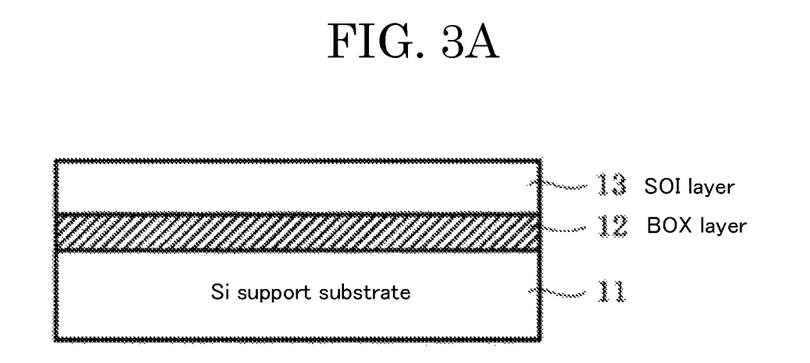
FIG. 3A is a cross-sectional view of an element structure in each step of a method for producing an integrated circuit formed of tunneling field-effect transistors of the present invention according to an embodiment (part 1-1).
Figure 3B:
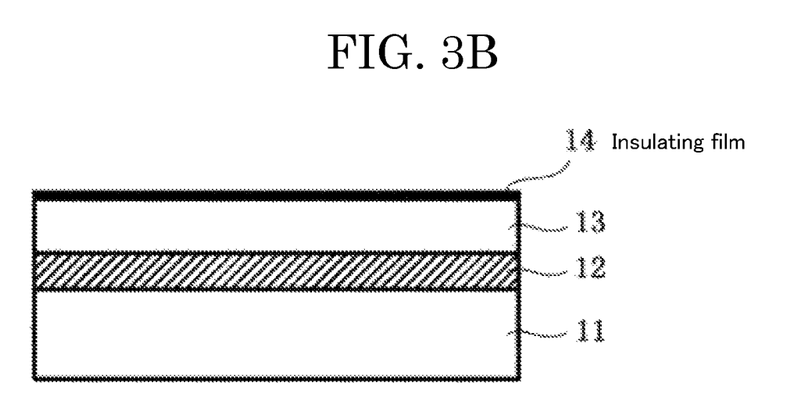
FIG. 3B is a cross-sectional view of an element structure in each step of a method for producing an integrated circuit formed of tunneling field-effect transistors of the present invention according to an embodiment (part 1-2).
Figure 3C:
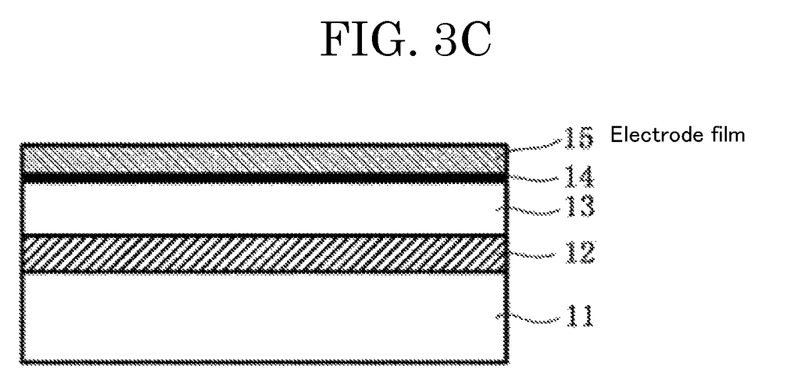
FIG. 3C is a cross-sectional view of an element structure in each step of a method for producing an integrated circuit formed of tunneling field-effect transistors of the present invention according to an embodiment (part 1-3).
Figure 3D:
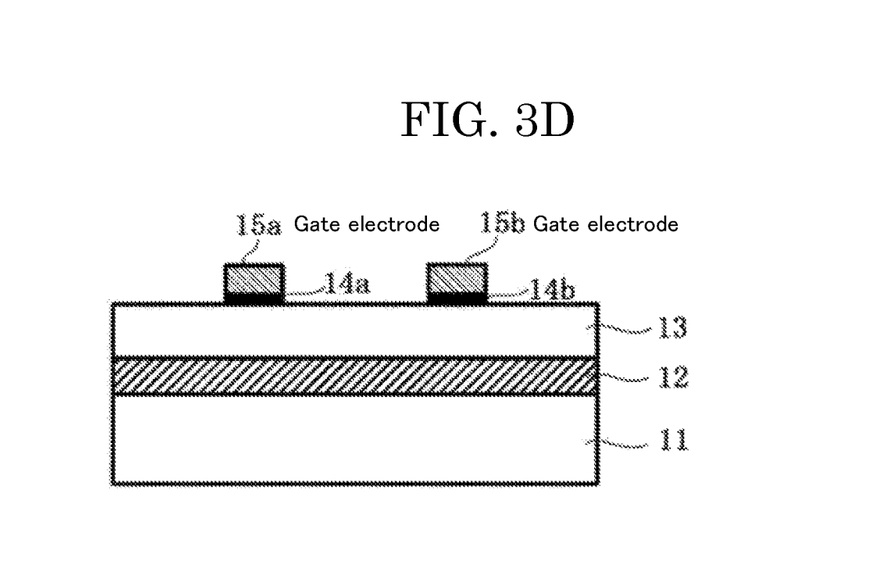
FIG. 3D is a cross-sectional view of an element structure in each step of a method for producing an integrated circuit formed of tunneling field-effect transistors of the present invention according to an embodiment (part 1-4).
Figure 4A:
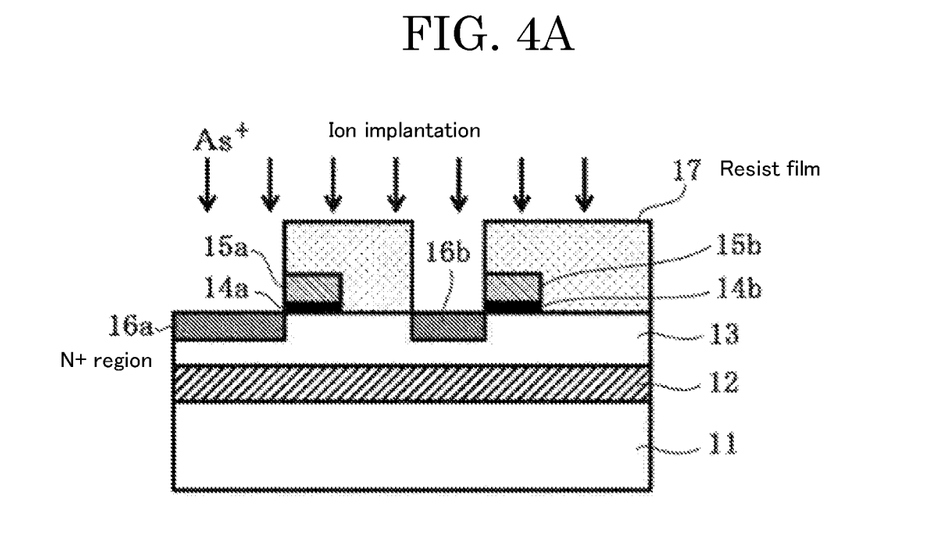
FIG. 4A is a cross-sectional view of an element structure in each step of a method for producing an integrated circuit formed of tunneling field-effect transistors of the present invention according to an embodiment (part 2-1).
Figure 4B:
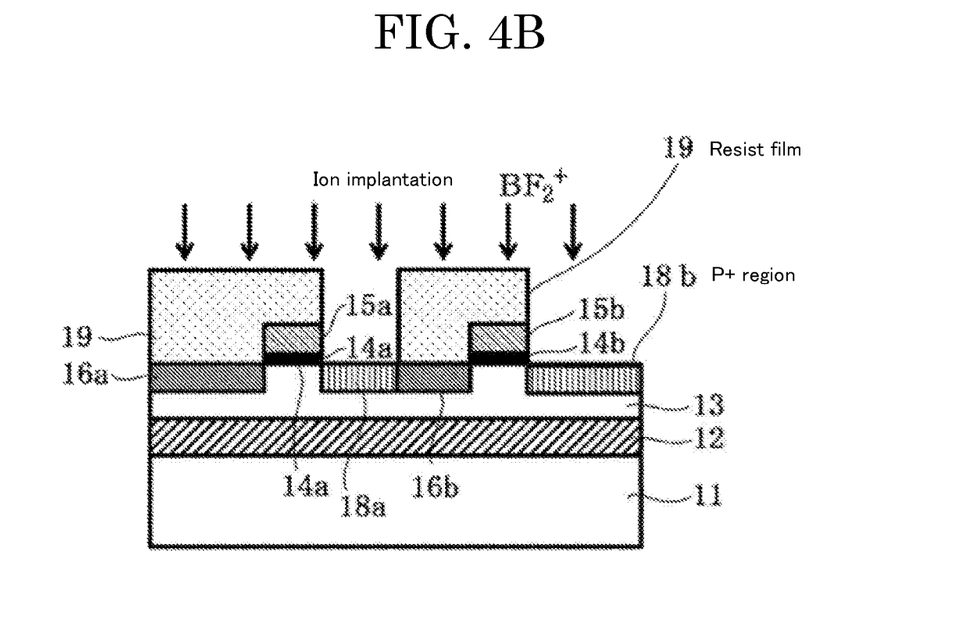
FIG. 4B is a cross-sectional view of an element structure in each step of a method for producing an integrated circuit formed of tunneling field-effect transistors of the present invention according to an embodiment (part 2-2).
Figure 5A:
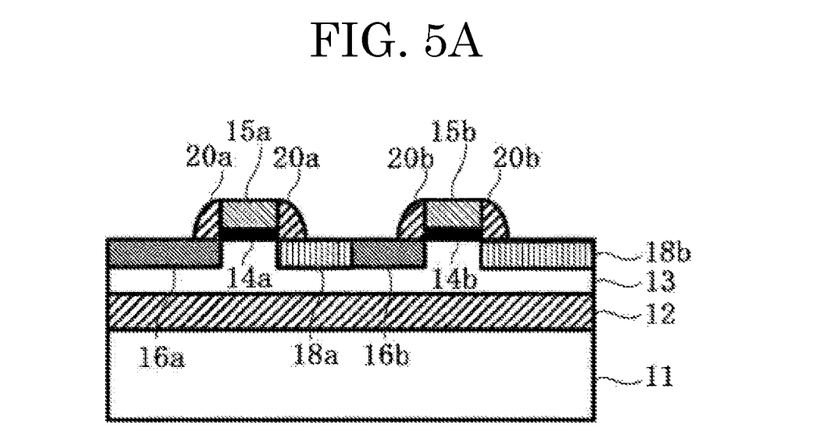
FIG. 5A is a cross-sectional view of an element structure in each step of a method for producing an integrated circuit formed of tunneling field-effect transistors of the present invention according to an embodiment (part 3-1).
Figure 5B:
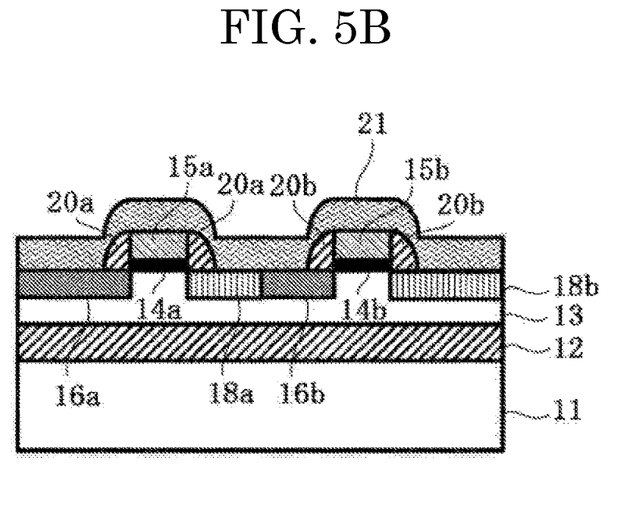
FIG. 5B is a cross-sectional view of an element structure in each step of a method for producing an integrated circuit formed of tunneling field-effect transistors of the present invention according to an embodiment (part 3-2).
Figure 5C:
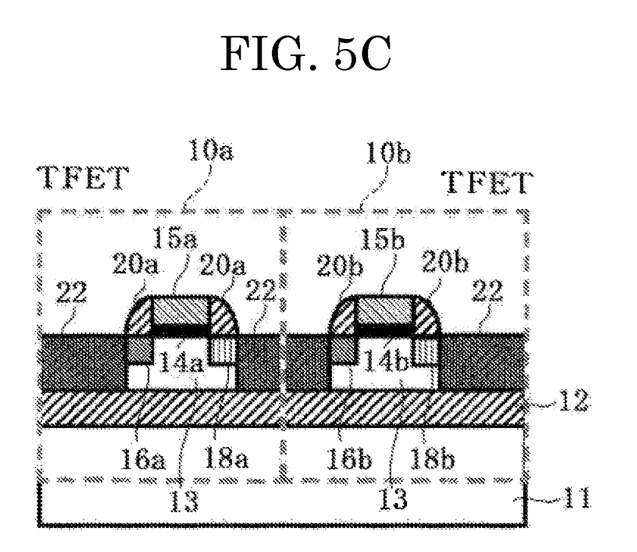
FIG. 5C is a cross-sectional view of an element structure in each step of a method for producing an integrated circuit formed of tunneling field-effect transistors of the present invention according to an embodiment (part 3-3).

FIG. 3 to FIG. 5 illustrate cross-sectional views of an element structure in each step of the method for producing an integrated circuit formed of tunneling field-effect transistors of the present invention according to an embodiment. The same structural portions as in FIG. 1 are denoted by the same reference numerals. First, as illustrated in FIG. 3A, a wafer (hereinafter may also be referred to as SOI substrate) is prepared. The wafer has a structure in which a BOX layer 12 having a thickness of 145 nm and a SOI layer 13 having a thickness of 50 nm and a P-type concentration of $1 \times 10^{15}$ cm$^{-3}$ are stacked on a surface of a Si support substrate 11. A total thickness of the SOI substrate is, for example, 525 μm.

Subsequently, the surface of the SOI substrate is washed with, for example, hydrofluoric acid and then heated under an oxygen atmosphere to form a silicon dioxide (SiO$_2$) layer having a thickness of about 1.0 nm. A HfO$_2$ film is further deposited on the silicon dioxide layer by an atomic layer deposition method (ALD), to form an insulating film 14 that is roughly formed of these two kinds of oxide films as illustrated in FIG. 3B.

Subsequently, a tantalum nitride (TaN) film is deposited to about 10 nm on the insulating film 14 by application of, for example, a sputtering method. Then, a polysilicon film is deposited to about 50 nm on the tantalum nitride film, to form a so-called MIPS (Metal Inserted Poly Silicon)-type electrode film 15 of a two-layered type as illustrated in FIG. 3C.

Subsequently, positions at which gates are to be produced are defined using, for example, a resist film having a film thickness of about 1 μm and an i stepper, and unnecessary portions of the insulating film 14 and electrode film 15 that are other than these portions are removed by reactive ion etching (RIE), to form a layer stacked portion that is for a first transistor and formed of a gate insulating film 14a and a gate electrode 15a and a layer stacked portion that is for a second transistor and formed of a gate insulating film 14b and a gate electrode 15b simultaneously as illustrated in FIG. 3D.

Subsequently, as illustrated in FIG. 4A, in a state that the surface of the element other than active regions at which N$^+$ regions are to be formed is covered with protective films using resist films 17 and an i stepper, arsenic (As$^+$), which is an example of an N-type impurity, is ionically implanted into the active regions from above, to form N$^+$ regions 16a and 16b. Conceivable As ion implantation conditions include, for example, an acceleration energy of 5 keV and a dose of about $2 \times 10^{15}$ cm$^{-2}$. After the As ion implantation, the resist films 17 are removed by SPM washing (washing with a sulfuric acid/hydrogen peroxide mixture liquid), which is performed after an ashing process.

Subsequently, as illustrated in FIG. 4B, in a state that the surface of the element other than active regions at which P$^+$ regions are to be formed is covered with protective films using resist films 19 and an i stepper, boron difluoride (BF$_2^+$), which is an example of a P-type impurity, is ionically implanted into the active regions from above, to form P$^+$ regions 18a and 18b. Conceivable ion implantation conditions include, for example, an acceleration energy of 5 keV and a dose of about $2 \times 10^{15}$ cm$^{-2}$. After the ion implantation, the resist films 19 are removed by SPM washing (washing with a sulfuric acid/hydrogen peroxide mixture liquid), which is performed after an ashing process.

Subsequently, as illustrated in FIG. 5A, sidewalls 20a and 20b are formed on the surface of the element that is in a state after the resist films 19 are removed from the cross-sectional structure illustrated in FIG. 4B, in order for the N$^+$ region 16a and the P$^+$ region 18a to be securely insulated from the gate electrode 15a and for the N$^+$ region 16b and the P$^+$ region 18b to be securely insulated from the gate electrode 15b. As a method for forming the sidewalls 20a and 20b, for example, there is a method of depositing silicon dioxide (SiO$_2$) to about 20 nm on the surface of the element by a chemical vapor deposition (CVD) method and etching the deposited silicon dioxide by the same thickness by a RIE method.

Subsequently, as illustrated in FIG. 5B, for example, a sputtering method is applied to the surface of the element that is in the state illustrated in FIG. 5A, to deposit titanium (Ti) to about 50 nm to form a Ti film 21. Finally, as illustrated in FIG. 5C, a titanium silicide (TiSi) film 22, which is an example of a metal semiconductor alloy film, is formed on the portions of the N$^+$ regions 16a and 16b and P$^+$ regions 18a and 18b unprotected by the sidewalls 20a and 20b, and unnecessary portions of the Ti film 21 are removed.

As a method for forming the TiSi film 22, for example, there is a method of heating the element on which the Ti film 21 illustrated in FIG. 5B is formed under a nitrogen atmosphere at 500° C. for about 1 minute to allow the Ti film 21 and the silicon portion of the SOI layer 13 to react with each other. If the heating time is set to about 5 minutes in this method, the depth of the TiSi film 22 reaches the BOX layer 12, resulting in a better structure. After this, unreacted portions of the Ti film 21 on the sidewalls 20a and 20b are removed. The removal is realized by etching with, for example, hydrochloric acid. When the gate electrodes 15a and 15b are polysilicon, polysilicon may react with Ti in the heating step to also form titanium silicide in the gate electrodes. However, this is not problematic in actual use.

In this way, as illustrated in FIG. 5C, an integrated circuit including two TFETs that are electrically connected with each other through the TiSi film 22 at the P$^+$ region 18a of the first TFET 10a and the N$^+$ region 16b of the second TFET 10b adjacent to each other, as in the structure described with reference to FIG. 1, is produced. In the integrated circuit produced in this way, the TiSi film 22 used for electrical connection can be formed using the silicon in the SOI layer 13 (semiconductor layer). Therefore, a further reduction in cost, etc. can be expected.

Figure 6A:
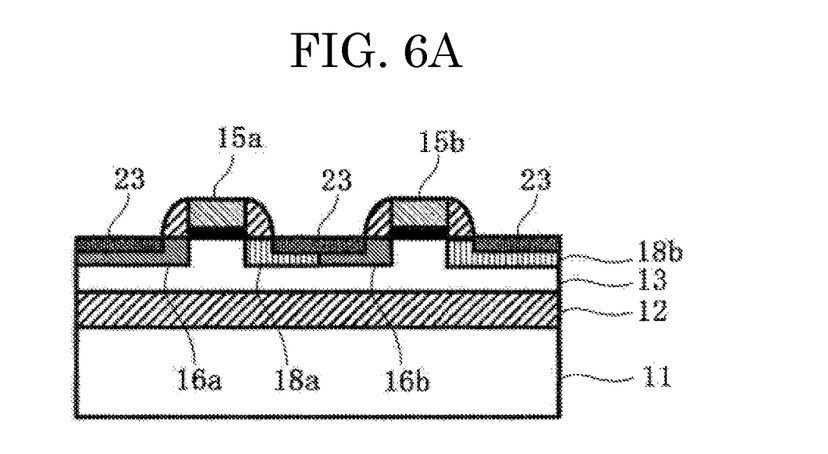
FIG. 6A is a cross-sectional view (1) for description of another example of depth of a titanium silicide (TiSi) film, etc.
Figure 6B:
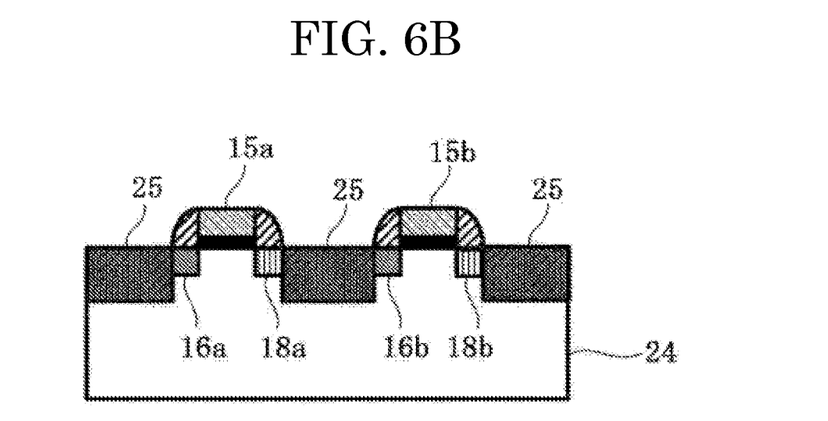
FIG. 6B is a cross-sectional view (2) for description of another example of depth of a titanium silicide (TiSi) film, etc.

When a substrate including a semiconductor on an insulator, such as an SOI substrate is used, it is desirable that the depth of the TiSi film 22 reach the surface of the BOX layer 12 as illustrated in FIG. 1 and FIG. 5C. When a so-called bulk substrate 24, which is not a silicon-on-insulator substrate, is used as illustrated in FIG. 6B, it is desirable that the TiSi film to be formed be formed down to a position deeper than the depths of the N$^+$ regions 16a and 16b and the P$^+$ regions 18a and 18b as indicated by 25 in FIG. 6B. This is for interposing the TiSi film 22 between the P$^+$ region 18a and the N$^+$ region 16b to effectively prevent occurrence of an unintended leakage current that may flow across the PN junction. Nevertheless, the TiSi film can serve the intended function of electrical connection even if its depth only reaches a position shallower than the depths of the N$^+$ regions 16a and 16b and the P$^+$ regions 18a and 18b as indicated by 23 in FIG. 6A. Moreover, in the bulk substrate 24, even if a PN junction is formed between the P$^+$ region 18a and the N$^+$ region 16b at a deeper position, the ion-implanted concentration will be lower at the deeper position than at a shallower position of the P$^+$ region 18a and the N$^+$ region 16b, which tends to make a depletion layer region of the PN junction large to make it likely that occurrence of the leakage current is suppressed. Therefore, forming the TiSi film down to the deeper position may generate disadvantages such as increase in cost, contrary to the intention.

Next, a result of simulation of the present embodiment will be described.

Figure 7:
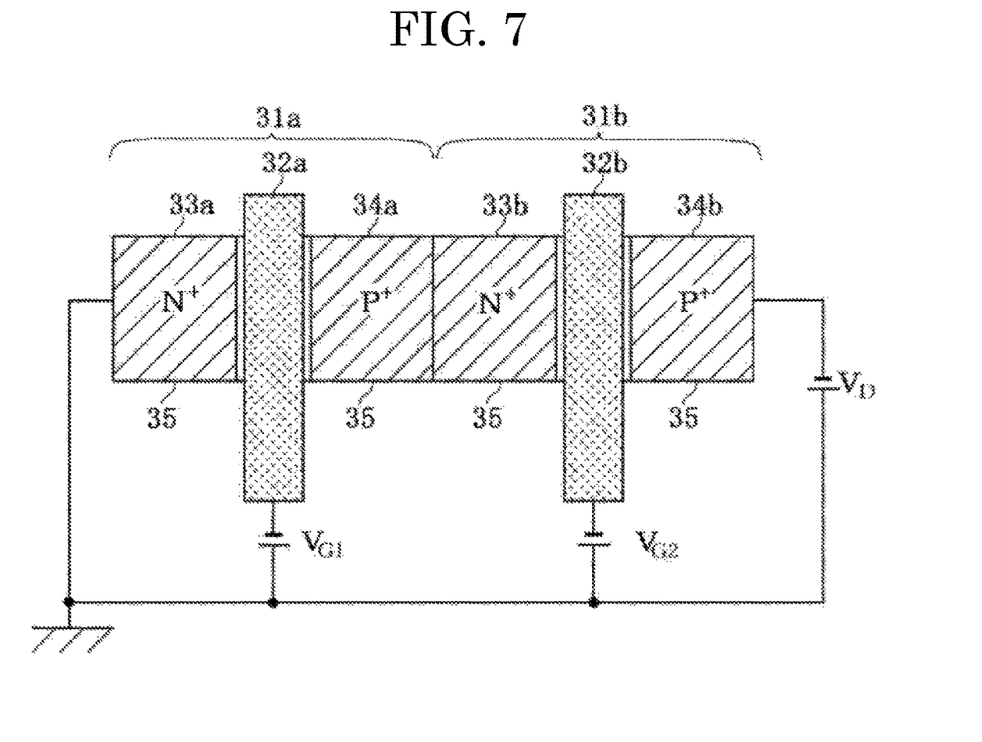
FIG. 7 is a diagram of a circuit for obtaining a result of simulation of an embodiment of the present invention.

FIG. 7 illustrates a diagram of a circuit for obtaining a result of simulation of the present embodiment. In the diagram, a first TFET 31*a* includes a gate electrode 32*a*, an N⁺ region 33*a*, and a P⁺ region 34*a*, and a second TFET 31*b* includes a gate electrode 32*b*, an N⁺ region 33*b*, and a P⁺ region 34*b*. Furthermore, a TiSi film 35, which is an example of a metal semiconductor alloy film such as illustrated in FIG. 1 and FIG. 5C, is formed from the top of the N⁺ regions 33*a* and 33*b* and the P⁺ regions 34*a* and 34*b* down to predetermined depths as exemplarily indicated by hatching in FIG. 7. The P⁺ region 34*a* of the first TFET 31*a* and the N⁺ region 33*b* of the second TFET 3 1*b* are electrically connected with each other through the TiSi film 35, to electrically connect the TFETs 31*a* and 31*b* with each other.

Figure 8:
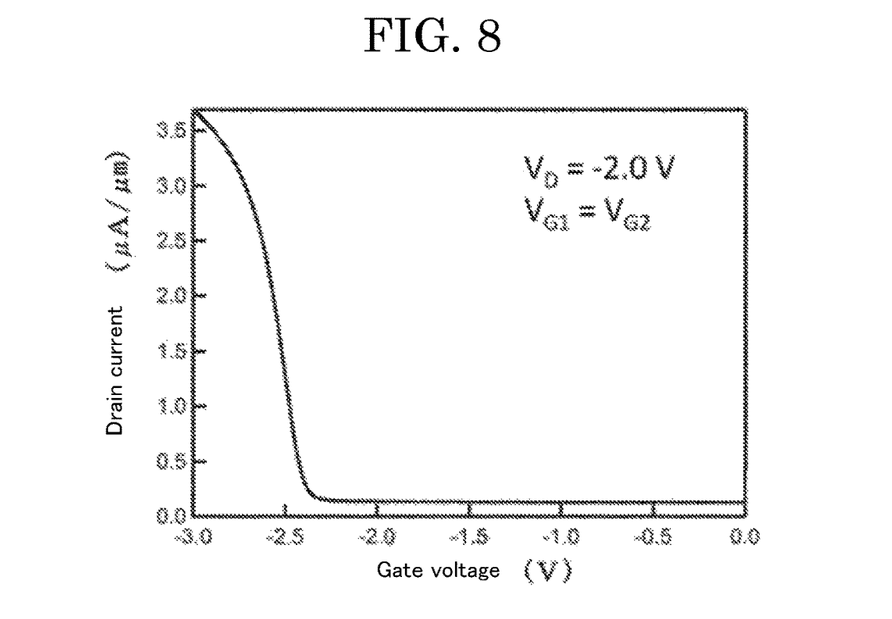
FIG. 8 is a graph of a gate voltage vs. drain current characteristic presenting the result of simulation of FIG. 7.

Here, it is assumed that the two TFETs 31*a* and 31*b* were operated as P-type transistors. A negative gate voltage $V_{G1}$ was applied to the gate electrode 32*a*, a negative gate voltage $V_{G2}$ was applied to the gate electrode 32*b*, and a negative drain voltage $V_D$ was applied to the TiSi portion 35. When the gate voltages $V_{G1}$ and $V_{G2}$ were gradually changed from 0V to a higher side in the negative direction keeping conditions of $V_{G1}=V_{G2}$ and $V_D=-2.0$ V, a result of the simulation was obtained as a gate voltage vs. drain current as illustrated in FIG. 8.

According to the result of the simulation, when the gate voltages $V_{G1}$ and $V_{G2}$ both became higher than around −2.3 V in the negative direction, the two TFETs 31*a* and 31*b* switched on to cause a drain current to flow. That is, it was confirmed that while the TFETs 31*a* and 31*b* were on, the P⁺ regions 34*a* and 34*b* operated as drain regions and the N⁺regions 33*a* and 33*b* operated as source regions to cause a drain current to flow in a direction from the N-type source regions to the P-type drain regions by quantum tunneling. In other words, it was confirmed that the two TFETs 31*a* and 31*b* were electrically connected with each other. If the P⁺ region 34*a* and the N⁺ region 33*b* had not been electrically connected with each other through the TiSi film 35, the two TFETs 31*a* and 31*b* would not have switched on to cause no drain current to flow.

The present invention is not limited to the embodiment described above. For example, it is possible to operate the electrically connected TFETs of the present embodiment as N-type transistors by applying positive gate voltages to the gate electrodes (or by making the source voltage lower and the drain voltage higher). Furthermore, it is possible to electrically connect 3 or more TFETs in the same manner. The titanium silicide films 22 and 35 are an example of the metal semiconductor alloy film, and examples of the material of the metal semiconductor alloy film include others. For example, silicon, germanium, and group III-V semiconductors can be used as the material of the channel (i.e., a semiconductor layer forming material). When the material of the channel is silicon, silicides of, for example, nickel (Ni), cobalt (Co), platinum (Pt), tungsten (W), molybdenum (Mo), and tantalum (Ta) can be used in addition to a silicide of Ti. When the material of the channel is germanium, alloys of germanium with Ni and Ti can be used. When the material of the channel is a group III-V semiconductor, an alloy of the group III-V semiconductor with, for example, Ni can be used.

APPLIED EXAMPLE

Figure 9:
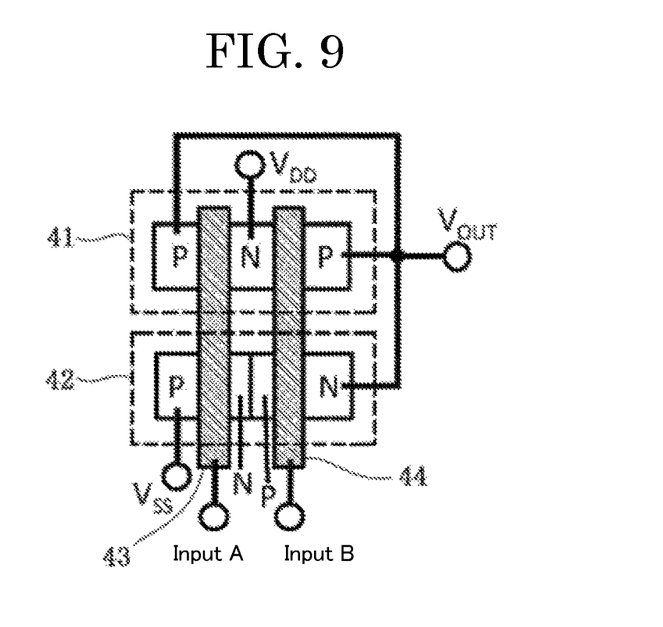
FIG. 9 is a diagram illustrating a configuration of an example of a NAND circuit to which the present invention is applied.

According to the present invention, adjacent source and drain regions that are included in two TFETs and have different conductivity types from each other can be electrically connected with each other through a metal semiconductor alloy. Therefore, the present invention can be applied to various logic circuits. FIG. 9 illustrates a configuration of an example of a NAND circuit to which the present invention is applied. In FIG. 9, reference numeral 41 denotes a parallel circuit of two TFETs, reference numeral 42 denotes a series circuit of different two TFETs, and reference numerals 43 and 44 denote gate electrodes. In FIG. 9, a metal semiconductor alloy (unillustrated) having a predetermined depth such as described in the embodiment is formed in upper portions of P regions denoted by "P" and of N regions denoted by "N". A drain voltage $V_{DD}$ is set to a higher voltage, and a source voltage $V_{SS}$ is set to a lower voltage. The two TFETs constituting the parallel circuit 41 operate as P-type TFETs, and the two TFETs constituting the series circuit 42 operate as N-type TFETs.

Figure 10:
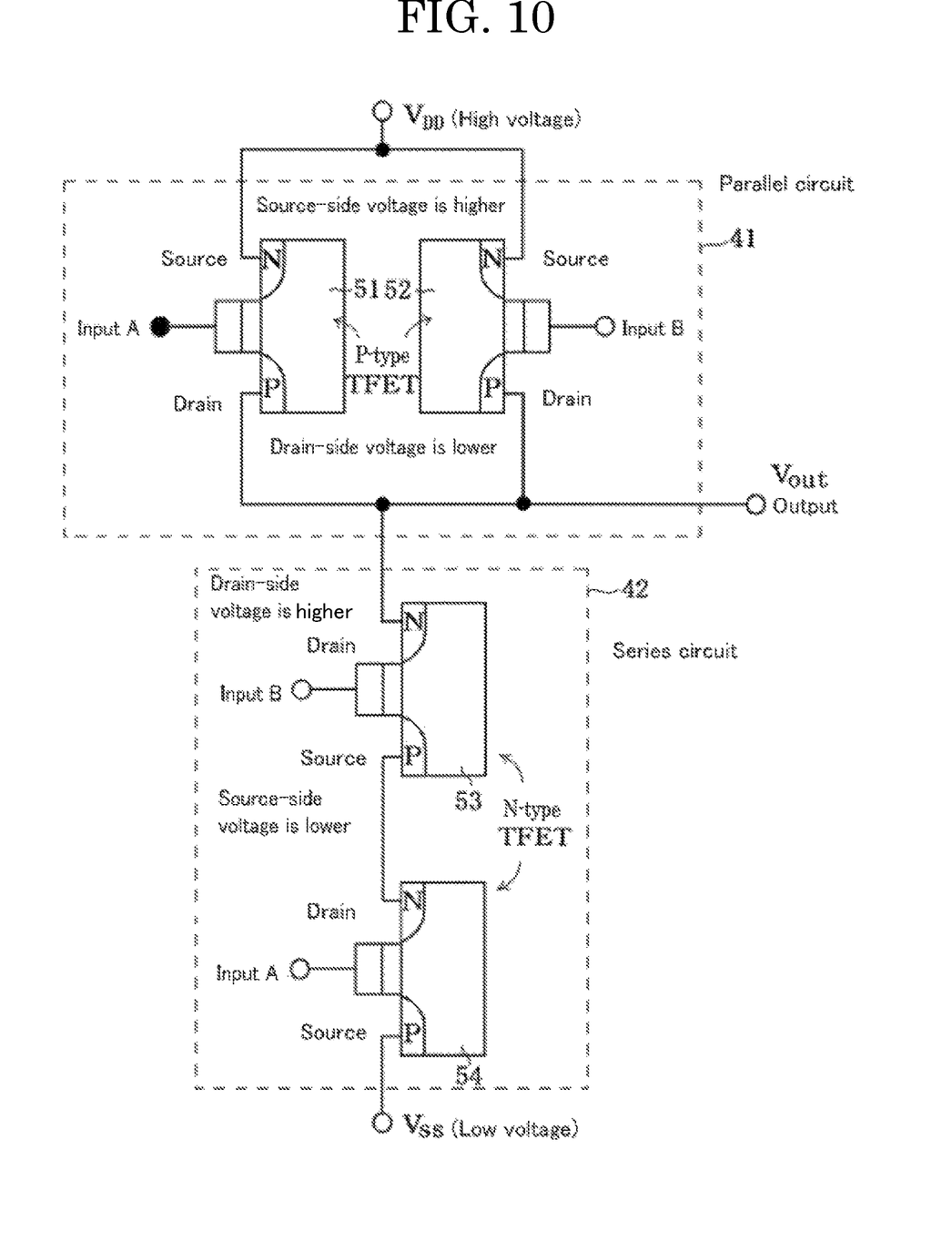
FIG. 10 is a configuration diagram more specifically illustrating the NAND circuit illustrated in FIG. 9.

FIG. 10 is a configuration diagram more specifically illustrating the NAND circuit illustrated in FIG. 9. In the diagram, the same configurational portions as in FIG. 9 are denoted by the same reference numerals. In FIG. 10, in the parallel circuit 41, N regions of a first TFET 51 and a second TFET 52 that are to become source regions of the first TFET 51 and the second TFET 52 are connected with each other, and P regions of the first TFET 51 and the second TFET 52 that are to become drain regions of the first TFET 51 and the second TFET 52 are connected with each other and also connected with an output terminal. An input voltage A is applied to a gate electrode of the first TFET 51, and an input voltage B is applied to a gate electrode of the second TFET 52. A high power supply voltage $V_{DD}$ is applied to the N regions of the TFETs 51 and 52. A power supply voltage $V_{SS}$ lower than $V_{DD}$ is applied to the P regions of the TFETs 51 and 52 through the series circuit 42. Hence, the TFETs 51 and 52 constituting the parallel circuit 41 operate as P-type TFETs because the source-side voltage $V_{DD}$ is higher than the drain-side voltage.

Meanwhile, in FIG. 10, in the series circuit 42, a P region of a third TFET 53 that is to become a source region of the third TFET 53 and an N region of a fourth TFET 54 that is to become a drain region of the fourth TFET 54 are electrically connected with each other through a metal semiconductor alloy as in the Example described above. In the third TFET 53, an N region that is to become a drain region is electrically connected with the P regions of the TFETs 51 and 52 through a metal semiconductor alloy as in the Example described above and also connected with the output terminal, and the input voltage B is applied to a gate electrode. In the fourth TFET 54, the power supply voltage $V_{SS}$ lower than $V_{DD}$ is applied as a source voltage to a P region that is to become a source region, and the input voltage A is applied to a gate electrode. Hence, the TFETs 53 and 54 constituting the series circuit 42 operate as N-type TFETs because the drain-side voltage applied to the N region of the TFET 53 is higher than the source-side voltage $V_{SS}$ at the TFET 54.

As can be seen, although the first TFET 51 and the fourth TFET 54 have a common gate electrode (43 in FIG. 9) to which the input voltage A is applied, the first TFET 51 operates as a P-type TFET and the fourth TFET 54 operates as an N-type TFET. Meanwhile, although the second TFET 52 and the third TFET 53 have a common gate electrode (44 in FIG. 9) to which the input voltage B is applied, the second TFET 52 operates as a P-type TFET and the third TFET 53 operates an N-type TFET.

Figure 11:
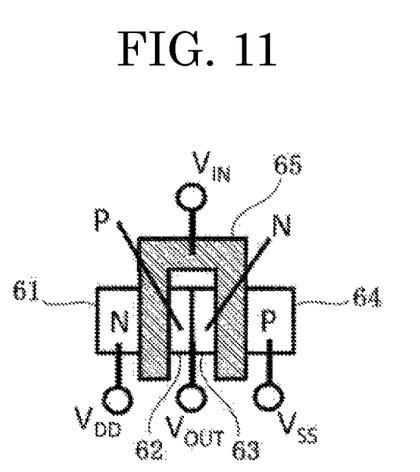
FIG. 11 is a diagram illustrating a configuration of an example of an inverter circuit to which the present invention is applied.

FIG. 11 illustrates a configuration of an example of an inverter circuit to which the present invention is applied. The inverter circuit illustrated in FIG. 11 includes: a first TFET including an N region 61, a P region 62, and a gate electrode 65; and a second TFET including an N region 63, a P region 64, and the gate electrode 65. A metal semiconductor alloy (unillustrated) having a predetermined depth such as described in the embodiment is formed in common in upper portions of at least the P region 62 and the N region 63 adjacent to each other to electrically connect the P region 62 and the N region 63 with each other.

A power supply voltage $V_{DD}$ applied to the N region 61 is set higher than a power supply voltage $V_{SS}$ applied to the P region 64. Therefore, although the first TFET and the second TFET include the gate electrode 65 in common, the first TFET operates as a P-type TFET in which the N region 61 is a source region and the P region is a drain region, and the second TFET operates as an N-type TFET in which the N region 63 is a drain region and the P region 64 is a source region. Hence, an input voltage $V_{IN}$ applied to the gate of the two TFETs including the gate electrode 65 in common is inverted in polarity and output as an output voltage $V_{OUT}$ through the metal semiconductor alloy (unillustrated) formed in common in the upper portions of the P region 62 and the N region 63.

REFERENCE SIGNS LIST 10a, 10b, 31a, 31b tunneling field effect transistor (TFET)
11 Si support substrate
12 BOX layer
13 SOI layer
14 insulating film
14a, 14b gate insulating film
15 electrode film
15a, 15b, 43, 44, 65 gate electrode
16a, 16b, 33a, 33b $N^+$ region
18a, 18b, 34a, 34b $P^+$ region
20a, 20b sidewall
21 titanium (Ti) film
22, 23, 25, 35 titanium silicide (TiSi) film
24 bulk substrate
41 parallel circuit
42 series circuit
51, 52 tunneling field-effect transistor (TFET) operating as P-type transistor
53, 54 tunneling field-effect transistor (TFET) operating as N-type transistor
61, 63 N region
62, 64 P region

The invention claimed is:

1. An integrated circuit formed of tunneling field-effect transistors, the integrated circuit comprising:
a first tunneling field-effect transistor in which one of a first P-type region and a first N-type region operates as a source region and the other one operates as a drain region; and
a second tunneling field-effect transistor in which one of a second P-type region and a second N-type region operates as a source region and the other one operates as a drain region,
the first tunneling field-effect transistor and the second tunneling field-effect transistor being formed in one active region to have a same polarity,
the first P-type region and the second N-type region being formed adjacently,
the first P-type region and the second N-type region that are adjacent being electrically connected with each other through a metal semiconductor alloy film,
wherein the metal semiconductor alloy film is formed in a manner to bridge the first P-type region and the second N-type region that are formed down to predetermined formation depths from a surface of a semiconductor layer and are disposed in a manner to face each other, and the metal semiconductor alloy film is formed down to a depth equal to or deeper than the formation depths of the first P-type region and the second N-type region from a position of the surface of the semiconductor layer.

2. The integrated circuit formed of tunneling field-effect transistors according to claim 1,
wherein the metal semiconductor alloy film is formed in a manner to bridge the first P-type region and the second N-type region that are formed down to predetermined formation depths from a surface of a semiconductor layer and are disposed in a manner to face each other, and the metal semiconductor alloy film is formed down to a depth shallower than the formation depths of the first P-type region and the second N-type region from a position of the surface of the semiconductor layer.

3. A method for producing an integrated circuit formed of tunneling field-effect transistors, the method comprising:
forming a first layer stacked structure and a second layer stacked structure on a common semiconductor layer at positions spaced from each other, the first layer stacked structure including a first insulating film and a first gate electrode stacked on the first insulating film, the second layer stacked structure including a second insulating film and a second gate electrode stacked on the second insulating film;
forming a first P-type region adjacently to the first layer stacked structure by implantation of P-type impurity ions and a second N-type region adjacently to the second layer stacked structure by implantation of N-type impurity ions in a surface of the semiconductor layer between the first layer stacked structure and the second layer stacked structure, and forming a first N-type region adjacently to the first layer stacked structure and in the surface of the semiconductor layer at a position opposite to the first P-type region by implantation of the N-type impurity ions and a second P-type region adjacently to the second layer stacked structure and in the surface of the semiconductor layer at a position opposite to the second N-type region by implantation of the P-type impurity ions, the first P-type region, the second P-type region, the first N-type region, and the second N-type region being formed in a manner that the first P-type region and the second N-type region are adjacent to each other;
forming a first sidewall on both of side surfaces of the first layer stacked structure on the semiconductor layer and a second sidewall on both of side surfaces of the second layer stacked structure on the semiconductor layer; and
forming a metal film on the semiconductor layer between the first sidewall and the second sidewall and heating the metal film to allow the metal film to react with the semiconductor layer to form a metal semiconductor alloy film,
wherein forming the metal semiconductor alloy film comprises forming the metal semiconductor alloy film in a manner to bridge the first P-type region and the second N-type region that are formed down to predetermined formation depths from the surface of the semiconductor layer and are disposed in a manner to face each other, and forming the metal semiconductor alloy film down to a depth equal to or deeper than the formation depths of the first P-type region and the second N-type region from a position of the surface of the semiconductor layer.

4. The method for producing an integrated circuit formed of tunneling field-effect transistors according to claim 3,
wherein forming the metal semiconductor alloy film comprises forming the metal semiconductor alloy film in a manner to bridge the first P-type region and the second N-type region that are formed down to predetermined formation depths from the surface of the semiconductor layer and are disposed in a manner to face each other, and forming the metal semiconductor alloy film down to a depth shallower than the formation depths of the first P-type region and the second N-type region from a position of the surface of the semiconductor layer.

\* \* \* \* \*